US010559350B2

(12) United States Patent
Oda et al.

(10) Patent No.: US 10,559,350 B2
(45) Date of Patent: Feb. 11, 2020

(54) MEMORY CIRCUIT AND ELECTRONIC DEVICE

(71) Applicant: KABUSHIKI KAISHA TOSHIBA, Minato-ku (JP)

(72) Inventors: Masato Oda, Yokohama (JP); Shinichi Yasuda, Setagaya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/127,894

(22) Filed: Sep. 11, 2018

(65) Prior Publication Data

US 2019/0287610 A1 Sep. 19, 2019

(30) Foreign Application Priority Data

Mar. 14, 2018 (JP) .................................. 2018-046687

(51) Int. Cl.

| G11C 11/412 | (2006.01) |
|---|---|
| G11C 8/00 | (2006.01) |
| G11C 11/40 | (2006.01) |
| G11C 11/417 | (2006.01) |
| G11C 8/16 | (2006.01) |
| H01L 21/8244 | (2006.01) |
| H01L 27/11 | (2006.01) |
| G11C 11/419 | (2006.01) |

(52) U.S. Cl.
CPC .......... *G11C 11/412* (2013.01); *G11C 11/419* (2013.01); *G11C 8/16* (2013.01); *H01L 27/11* (2013.01)

(58) Field of Classification Search
CPC ....... G11C 11/412; G11C 11/419; G11C 8/16; H01L 27/11
USPC .............................. 365/154, 155, 156, 51, 63
See application file for complete search history.

(56) References Cited

U.S. PATENT DOCUMENTS

| 5,177,706 A * | 1/1993 | Shinohara ................ G11C 8/16 365/189.04 |
|---|---|---|
| 5,475,638 A * | 12/1995 | Anami .................. G11C 11/412 365/189.11 |
| 5,768,179 A | 6/1998 | Hart |

(Continued)

FOREIGN PATENT DOCUMENTS

| JP | 2007-52879 | 3/2007 |
|---|---|---|
| JP | 2013-37757 | 2/2013 |

*Primary Examiner* — Ly D Pham
(74) *Attorney, Agent, or Firm* — Oblon, McClelland, Maier & Neustadt, L.L.P.

(57) ABSTRACT

A memory circuit according to an embodiment includes: a first inverter circuit including a first p-channel MOS transistor and a first n-channel MOS transistor; a second inverter circuit cross-coupled with the first inverter and including a second p-channel MOS transistor and a second n-channel MOS transistor; a third n-channel MOS transistor in which one of a source and drain terminals is connected to a first output terminal of the first inverter circuit, and a gate terminal is connected to a first wiring line; a fourth n-channel MOS transistor connected to the third n-channel MOS transistor; a fifth n-channel MOS transistor in which one of a source and drain terminals is connected to a second output terminal of the second inverter circuit; and a sixth n-channel MOS transistor connected to the fifth n-channel MOS transistor.

5 Claims, 11 Drawing Sheets

(56) References Cited

U.S. PATENT DOCUMENTS

| | | | |
|---|---|---|---|
| 6,101,116 A * | 8/2000 | Lien | G11C 15/04 |
| | | | 365/154 |
| 6,556,487 B1 | 4/2003 | Ratnakumar et al. | |
| 7,599,210 B2 | 10/2009 | Okazaki et al. | |
| 9,779,814 B2 | 10/2017 | Wang | |
| 2004/0252554 A1 | 12/2004 | Fournel et al. | |
| 2006/0098516 A1* | 5/2006 | Nakashima | G11C 8/08 |
| | | | 365/230.03 |
| 2007/0041242 A1 | 2/2007 | Okazaki et al. | |
| 2011/0157965 A1* | 6/2011 | Nii | G11C 11/4125 |
| | | | 365/156 |
| 2013/0039127 A1 | 2/2013 | Wang | |
| 2014/0098596 A1* | 4/2014 | Poulton | G11C 8/16 |
| | | | 365/154 |

* cited by examiner

MEMORY CIRCUIT AND ELECTRONIC DEVICE

CROSS REFERENCE TO RELATED APPLICATIONS

This application is based upon and claims the benefit of priority from the prior Japanese Patent Application No. 2018-046687, filed on Mar. 14, 2018, the entire contents of which are incorporated herein by reference.

FIELD

Embodiments described herein relate generally to memory circuits and electronic devices.

BACKGROUND

Field programmable gate arrays (FPGAs) are integrated circuits that can achieve an arbitrary logical function. An FPGA includes logic blocks (LBs) that perform arbitrary logical operations, and switch blocks (SBs) that switch connections among the logic blocks. The logic block includes at least one look-up table (LUT) circuit, which outputs a value stored in a memory in response to an input. The look-up table circuit may have a function to switch wiring lines by rewriting the memory. The logic block may also include a flip-flop (FF) circuit and/or a hard macro. The flip-flop circuit may be connected to an output of the look-up table circuit, or directly connected to an input terminal of the logic block. The hard macro herein means a pre-designed circuit group. Examples of the hard macro include a half adder including an AND gate and an XOR gate, and a full adder additionally including an OR gate.

An arbitrary operation circuit and/or a wiring line connection of the FPGA may be achieved by means of a memory value written to a cell of a configuration memory. If a memory value of the LUT circuit is changed, a memory value selected in response to an arbitrary input may be outputted. The configuration memory or the switch block includes a transistor switch, which may be turned on or off by changing the value of the memory connected to its gate. A MUX circuit including a plurality of transistor switches controls a connection between arbitrarily selected input and output by changing the memory value.

Conventional configuration memories include a volatile memory with SRAM cells. The SRAM cell includes two inverter circuits that are cross-coupled. An output of one of the inverter circuits is connected to an input of the other. The memory value may be fixed by providing a value to be written and its inverted bit to access transistor circuits connected to the inputs of the two inverter circuits. The SRAM cells are widely used in configuration memories of FPGAs since they may be formed by a standard CMOS process, and the memory values of the SRAM cells may be easily rewritten.

However, the SRAM cells are volatile cells, and the memory values stored in them are erased when the power is turned off. Furthermore, there is a possibility that a soft error may be caused in the SRAM cells, in which the memory values are changed due to noise. If a soft error is caused in a file memory, the soft error may be solved by using an error check and correct (ECC) memory. However, in an FPGA, the memory value is directly reflected in the operation of the logic circuit, and therefore it is difficult to provide an ECC to the FPGA. Furthermore, if a soft error occurs in an FPGA, the content of an operation changes, which greatly affects the operation.

A nonvolatile configuration memory may solve the problem of soft error. There are a large number of examples in which a nonvolatile memory is directly used as a configuration memory. However, a nonvolatile memory generally operates slower than an SRAM memory. Therefore, time and costs incurred in developing a nonvolatile memory may be increased.

There is an example in which an SRAM cell includes a nonvolatile memory to enable the use of both the SRAM cell and the nonvolatile memory. This example has a configuration where floating gate type memory transistors are disposed between access transistors and a memory portion of the SRAM cell. Data is written to one of the floating gate type memory transistors so that it is in a low-resistance state when a read operation is performed. When a High level potential and a Low level potential is given to respective bit lines, a current flows on the side where the memory transistor to which the data is written is present. The value of the SRAM cell is fixed by the value of the memory transistor. In this case, three power supplies for writing data to, erasing data from, and reading data from the memory transistor are needed. In order to control the three power supplies, at least three power supply control systems are needed. Since the memory in this example needs to rewrite the nonvolatile memory, the three power supplies should be provided. Furthermore, since the memory transistor needs to be formed by a process that is different from a standard manufacturing process, additional costs are incurred to form the memory transistors. In addition, the charge retaining nonvolatile memory as described above may lose the memory value if being subjected to noise or a high temperature for a long time.

DETAILED DESCRIPTION

A memory circuit according to an embodiment includes: a first inverter circuit including a first input terminal, a first output terminal, a first p-channel MOS transistor in which a source terminal is connected to a first power supply line and a gate terminal is connected to the first input terminal, and a first n-channel MOS transistor in which a source terminal is connected to a second power supply line, a drain terminal is connected to a drain terminal of the first p-channel MOS transistor, and a gate terminal is connected to the first input terminal; a second inverter circuit including a second input terminal connected to the first output terminal, a second output terminal connected to the first input terminal, a second p-channel MOS transistor in which a source terminal is connected to the first power supply line and a gate terminal is connected to the second input terminal, and a second n-channel MOS transistor in which a source terminal is connected to the second power supply line, a drain terminal is connected to a drain terminal of the second p-channel MOS transistor, and a gate terminal is connected to the second input terminal; a third n-channel MOS transistor in which one of a source terminal and a drain terminal is connected to the first output terminal and the second input terminal, and a gate terminal is connected to a first wiring line; a fourth n-channel MOS transistor in which one of a source terminal and a drain terminal is connected to the other of the source terminal and the drain terminal of the third n-channel MOS transistor, and the other of the source terminal and the drain terminal is connected to a second wiring line, and a gate terminal is connected to a third wiring line; a fifth n-channel MOS transistor in which one of a source terminal and a drain terminal is connected to the second output terminal and the first input terminal, and a gate terminal is connected to the first wiring line; and a sixth n-channel MOS transistor in which one of a source terminal and a drain terminal is connected to the other of the source terminal and the drain terminal of the fifth n-channel MOS transistor, the other of the source terminal and the drain terminal is connected to a fourth wiring line, and a gate terminal is connected to the third wiring line.

Embodiments of the present invention will now be described with reference to the accompanying drawings.

First Embodiment

Figure 1:
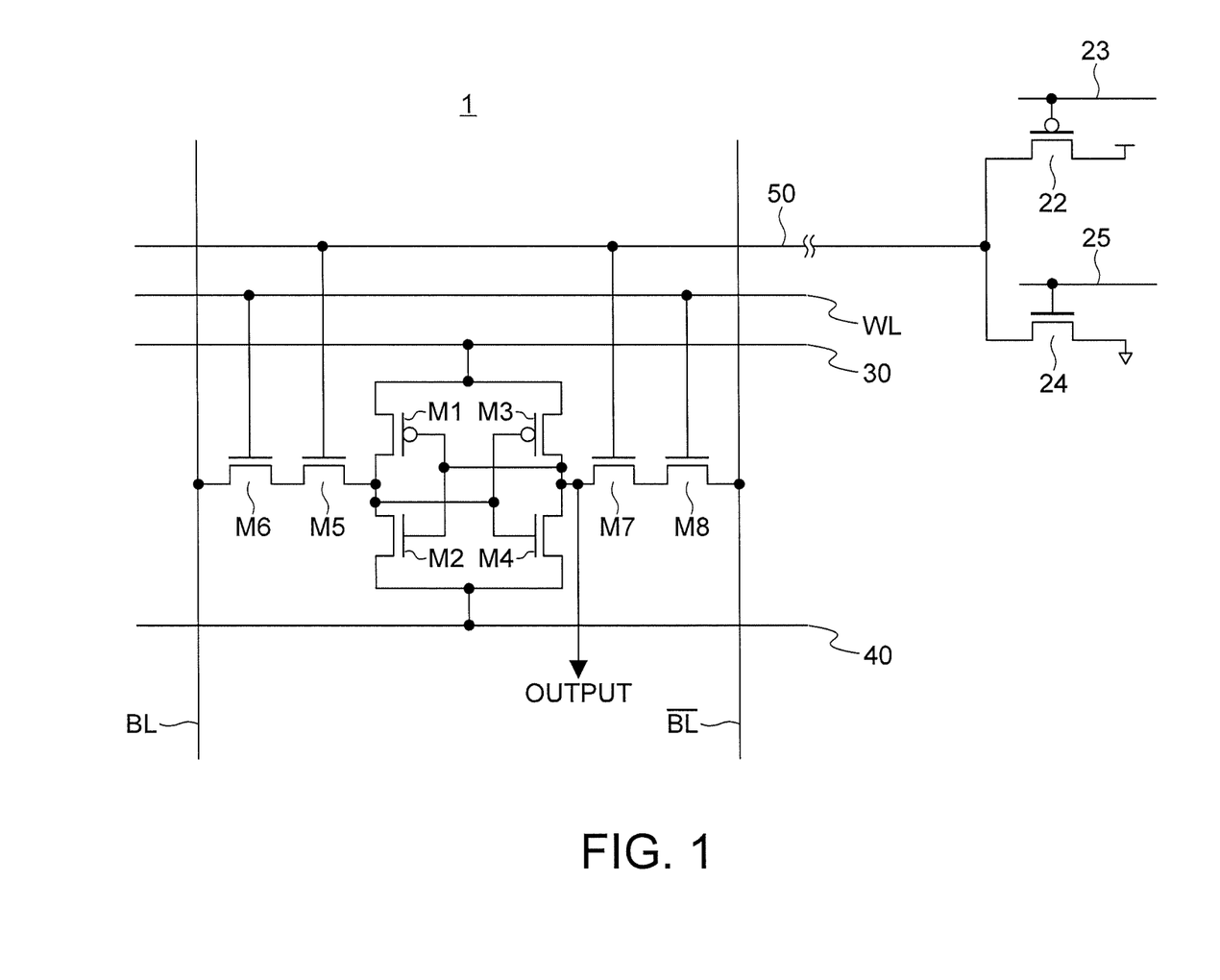
FIG. 1 is a circuit diagram illustrating a memory circuit according to a first embodiment.

A configuration memory circuit ("memory circuit") according to a first embodiment includes at least one memory cell, which is shown in FIG. 1. The memory cell 1 includes p-channel MOS transistors ("transistors") M1 and M3, and n-channel MOS transistors ("transistors") M2, M4, M5, M6, M7, and M8.

The transistor M1 and the transistor M2 are included in a first inverter circuit, and the transistor M3 and the transistor M4 are included in a second inverter circuit. The first inverter circuit and the second inverter circuit are cross-coupled. Specifically, an input terminal of the first inverter circuit, namely a gate terminal of the transistor M1 and a gate terminal of the transistor M2, is connected to an output terminal of the second inverter circuit, namely a drain terminal of the transistor M3 and a drain terminal of the transistor M4, and an input terminal of the second inverter circuit, namely a gate terminal of the transistor M3 and a gate terminal of the transistor M4, is connected to an output terminal of the first inverter circuit, namely a drain terminal of the transistor M1 and a drain terminal of the transistor M2. A source terminal of the transistor M1 and a source terminal of the transistor M3 are connected to a power supply line 30. A source terminal of the transistor M2 and a source terminal of the transistor M4 are connected to a power supply line 40.

One of a source terminal and a drain terminal of the transistor M5 is connected to the output terminal of the first inverter circuit and the input terminal of the second inverter circuit, and the other is connected to one of a source terminal and a drain terminal of the transistor M6, and a gate terminal of the transistor M5 is connected to a write and read wiring line 50.

The other of the source terminal and the drain terminal of the transistor M6 is connected to a bit line BL, and a gate terminal of the transistor M6 is connected to a word line WL.

One of a source terminal and a drain terminal of the transistor M7 is connected to the input terminal of the first inverter circuit and the output terminal of the second inverter circuit, and the other is connected to one of a source terminal and a drain terminal of the transistor M8, and a gate terminal of the transistor M7 is connected to the write and read wiring line 50.

The other of the source terminal and the drain terminal of the transistor M8 is connected to a bit line /BL, and a gate terminal of the transistor M8 is connected to the word line WL.

Although an output of the memory cell 1 is outputted from the output terminal of the second inverter circuit in this embodiment, the output may be outputted from the output terminal of the first inverter circuit.

The memory circuit according to this embodiment further includes a p-channel MOS transistor 22 and an n-channel MOS transistor 24. The p-channel MOS transistor ("transistor") 22 has a gate insulating film thicker than that of the transistors M1 and M3, and the n-channel MOS transistor ("transistor") 24 has a gate insulating film thicker than that of the transistors M2, M4, M5, M6, M7, and M8. Thus, the p-channel MOS transistor 22 and the n-channel MOS transistor 24 are high-breakdown-voltage MOS transistors. A source terminal of the transistor 22 is connected to a write voltage source, a drain terminal is connected to the write and read wiring line 50, and a gate terminal is connected to a write wiring line 23. A source terminal of the transistor 24 is connected to a ground power supply, a drain terminal is connected to the write and read wiring line 50, and a gate terminal is connected to a read wiring line 25. As will be described later, the transistors 22 and 24 are used in a write operation and a read operation, and controlled by a control circuit that is not shown.

The transistors M1 to M8 of the memory circuit according to this embodiment having the above-described configuration are formed by a standard CMOS process, and the gate insulating films of the transistors M5 and the transistor M7 are used as anti-fuses. The transistors M6 and M8 are called access transistors.

A write voltage or a read voltage is applied to the gate terminals of the transistors M5 and M7. The memory circuit has a simplest circuit configuration, and a small occupied area. If the transistors M5 and M7 are used as anti-fuses, there is a possibility that breakdown occurs between the gate terminal and only one of the source terminal and the drain terminal, depending on which process generation the transistors belong to. If, for example, the gate insulating film is broken between the gate terminal and only one of the source terminal and the drain terminal, which is on the access transistor side, in the transistor serving as an anti-fuse, no data may be provided to the SRAM cell, and the value of the SRAM cell may not be fixed.

(First Modification)

Figure 2:
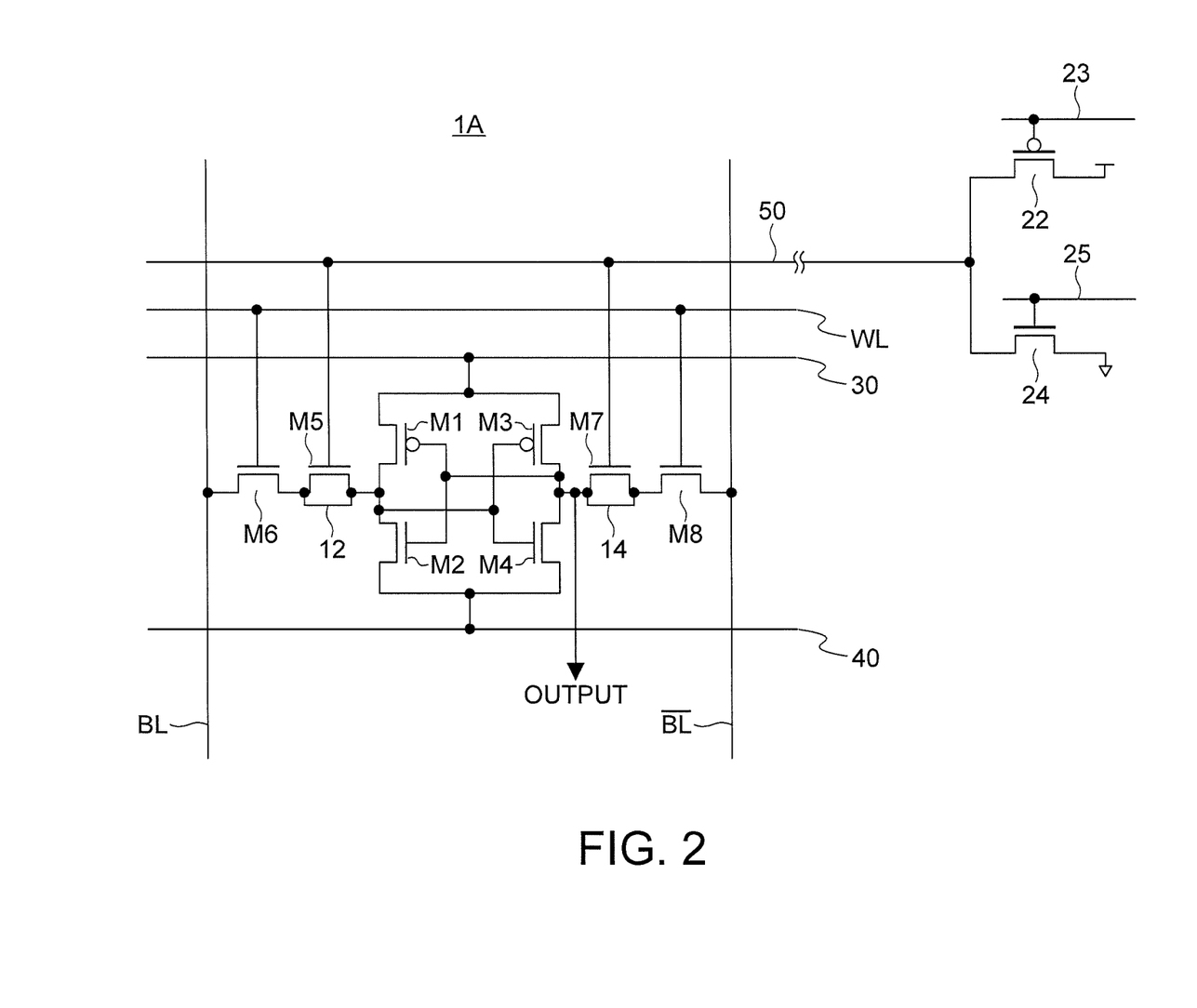
FIG. 2 is a circuit diagram illustrating a memory circuit according to a first modification of the first embodiment.

FIG. 2 shows a memory circuit according to a first modification of this embodiment. The memory circuit according to the first modification is obtained by replacing the memory cell 1 of the memory circuit shown in FIG. 1 with a memory cell 1A. The memory cell 1A has a structure obtained by connecting the source terminal and the drain terminal of the transistor M5 with a metal wiring line 12, and connecting the source terminal and the drain terminal of the transistor M7 with a metal wiring line 14 in the memory cell 1.

In the memory circuit according to the first modification, the value of the SRAM cell may be fixed by selectively breaking the gate insulating film of one of the transistors M5 and M7 serving as anti-fuses so that an arbitrary value may be fixed and read in a read operation. Unlike the memory circuit according to the first embodiment shown in FIG. 1, the source terminal and the drain terminal of each of the transistors M5 and M7 are connected to each other with the metal wiring line 12 or 14 in the memory circuit according to the first modification. Therefore, if the gate insulating film of only the source terminal side or the drain terminal side is broken, the intended operation may be performed. Even if what value is set at the gate terminal of the anti-fuse, a normal SRAM operation may be performed by this short circuit, before a write operation is performed.

(Anti-Fuse Write Operation)

Figure 3:
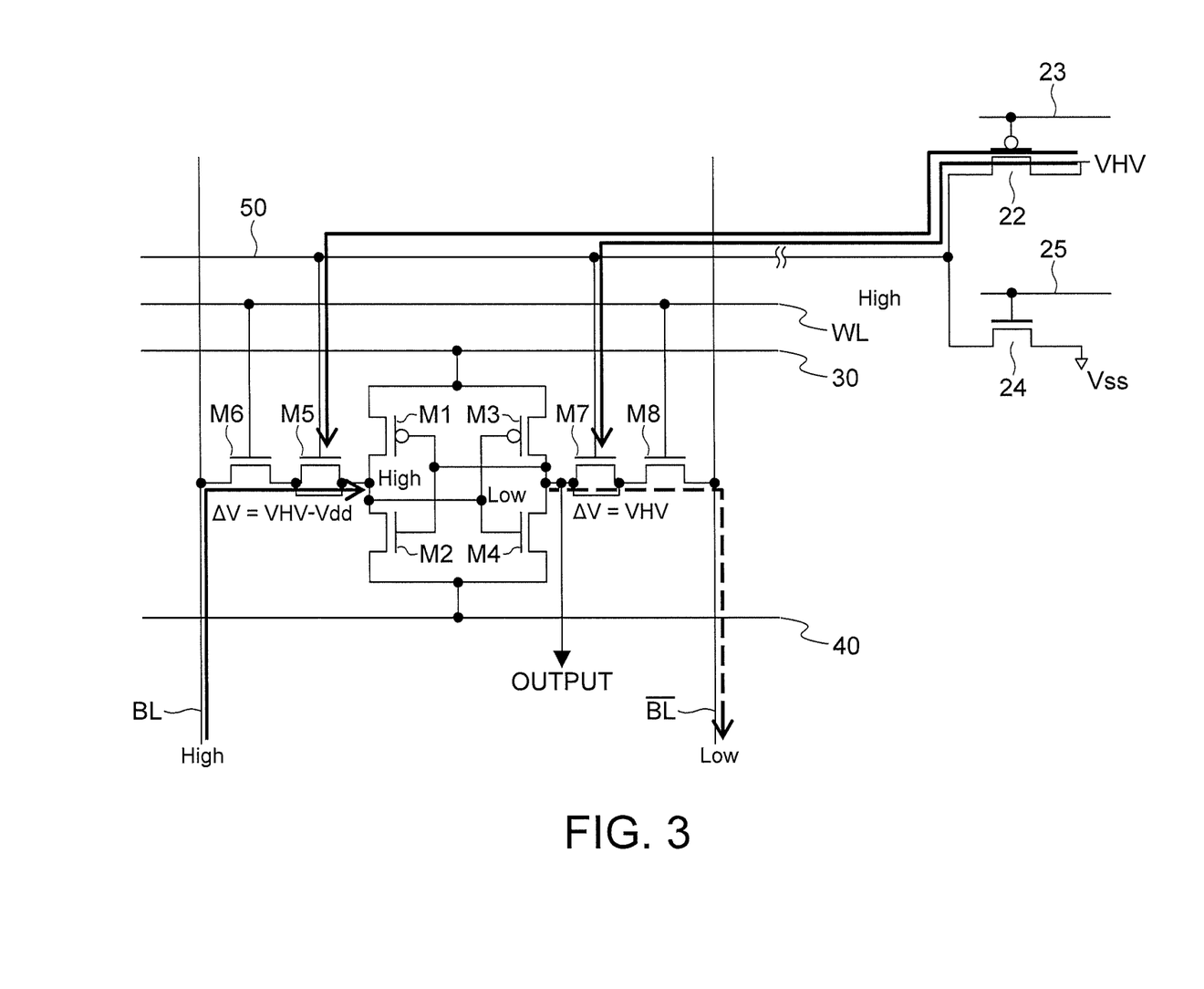
FIG. 3 is an explanatory diagram of an anti-fuse write operation of the memory circuit according to the first embodiment.

An anti-fuse write operation of the memory circuit according to this embodiment will be described with reference to FIG. 3.

An example in which the transistor M7 is selected from the transistor M5 and the transistor M7, and the gate insulating film of the transistor M7 is to be broken will be described. Like an operation to write data to an SRAM cell, a low level (Low) voltage Vss is applied to the bit line /BL on the side of the transistor M7, the gate insulating film of which is intended to be broken, and a high level (High) voltage Vdd is applied to the bit line BL on the side of the transistor M5, the gate insulating film of which is intended to be protected. The voltage Vdd is also applied to the word line in order to turn on the transistor M6 and the transistor M8. Thereafter, a voltage to turn on the transistor 22 is applied to the write wiring line 23, and a write voltage VHV is supplied to the write and read wiring line 50. The write voltage VHV is greater than the breakdown voltage to break the gate insulating film of the transistor M5 or the transistor M7 serving as the anti-fuse, and the breakdown voltage to break the gate insulating film is greater than the difference between the write voltage VHV and the voltage Vdd.

In this case, since the write voltage VHV is applied to the gate terminal and the voltage Vdd is applied to one of the source terminal and the drain terminal of the transistor M5, a voltage ΔV between the gate terminal and at least one of the source terminal and the drain terminal is VHV-Vdd, which is smaller than the breakdown voltage to break the gate insulating film of the transistor M5. Therefore, the gate insulating film of the transistor M5 is not broken and protected. However, since the write voltage VHV is applied to the gate terminal and the voltage Vss (=0V) is applied to one of the source terminal and the drain terminal of the transistor M7, the voltage ΔV between the gate terminal and at least one of the source terminal and the drain terminal is VHV, which is greater than the breakdown voltage to break the gate insulating film of the transistor M7. Therefore, the gate insulating film of the transistor M7 is broken. The anti-fuse write operation is performed on the transistor M7 in this fashion. If the write operation is performed on the transistor M5, the voltage applied to the bit line BL is Vss, and the voltage applied to the bit line /BL is Vdd.

The anti-fuse write operation performed on the first embodiment shown may be performed in the same manner on the memory circuit according to the first modification shown in FIG. 2.

In the write operation and the read operation, the voltage Vdd is supplied to the power supply line 30, and the voltage Vss is supplied to the power supply line 40.

(Second Modification)

Figure 4:
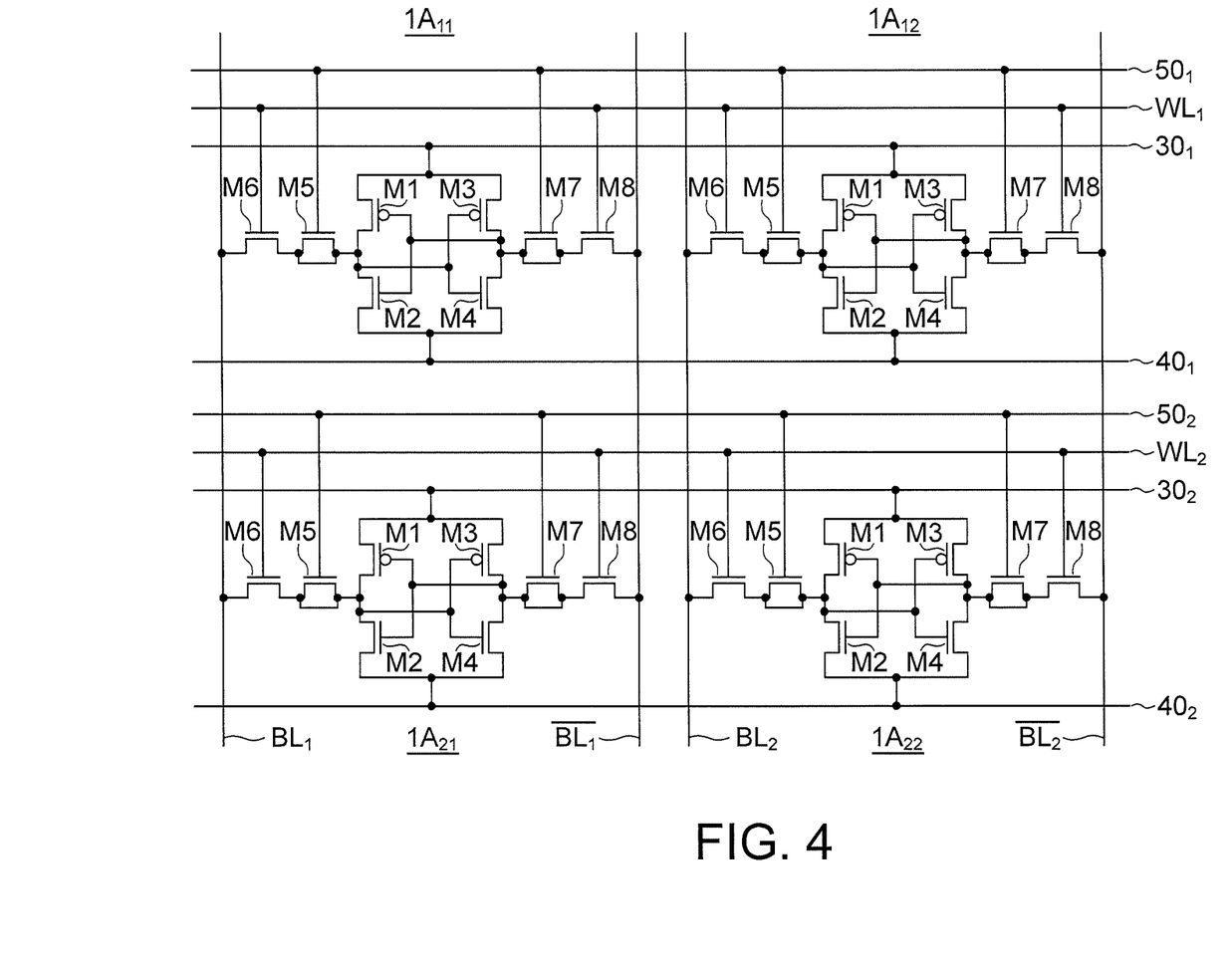
FIG. 4 is a circuit diagram illustrating a memory circuit according to a second modification of the first embodiment.

A memory circuit according to a second modification of the first embodiment is shown in FIG. 4. The memory circuit according to the second modification includes memory cells $1A_{11}$ to $1A_{22}$ arranged in a 2×2 array. Each memory cell $1A_{ij}$ (i, j=1, 2) has the same structure as the memory cell 1A of the memory circuit according to the first modification shown in FIG. 2. Although the memory cells are arranged in a 2×2 array in this modification, they may be arranged in an m×n array, where m and n are natural numbers, each of which is 1 or more.

In each memory cell $1A_{ij}$ (i, j=1, 2), the source terminals of the transistors M1 and M3 are connected to a power supply line $30_i$, the source terminals of the transistors M2 and M4 are connected to a power supply line $40_i$, the gate terminals of the transistors M5 and M7 are connected to a write and read wiring line $50_i$, the gate terminals of the transistors M6 and M8 are connected to a word line $WL_i$, the other of the source terminal and the drain terminal of the transistor M6 is connected to a bit line $BL_j$, and the other of the source terminal and the drain terminal of the transistor M8 is connected to a bit line $/BL_j$. The transistors 22 and 24 shown in FIGS. 1 and 2 are omitted in FIG. 4.

(Anti-Fuse Write Operation)

Figure 5:
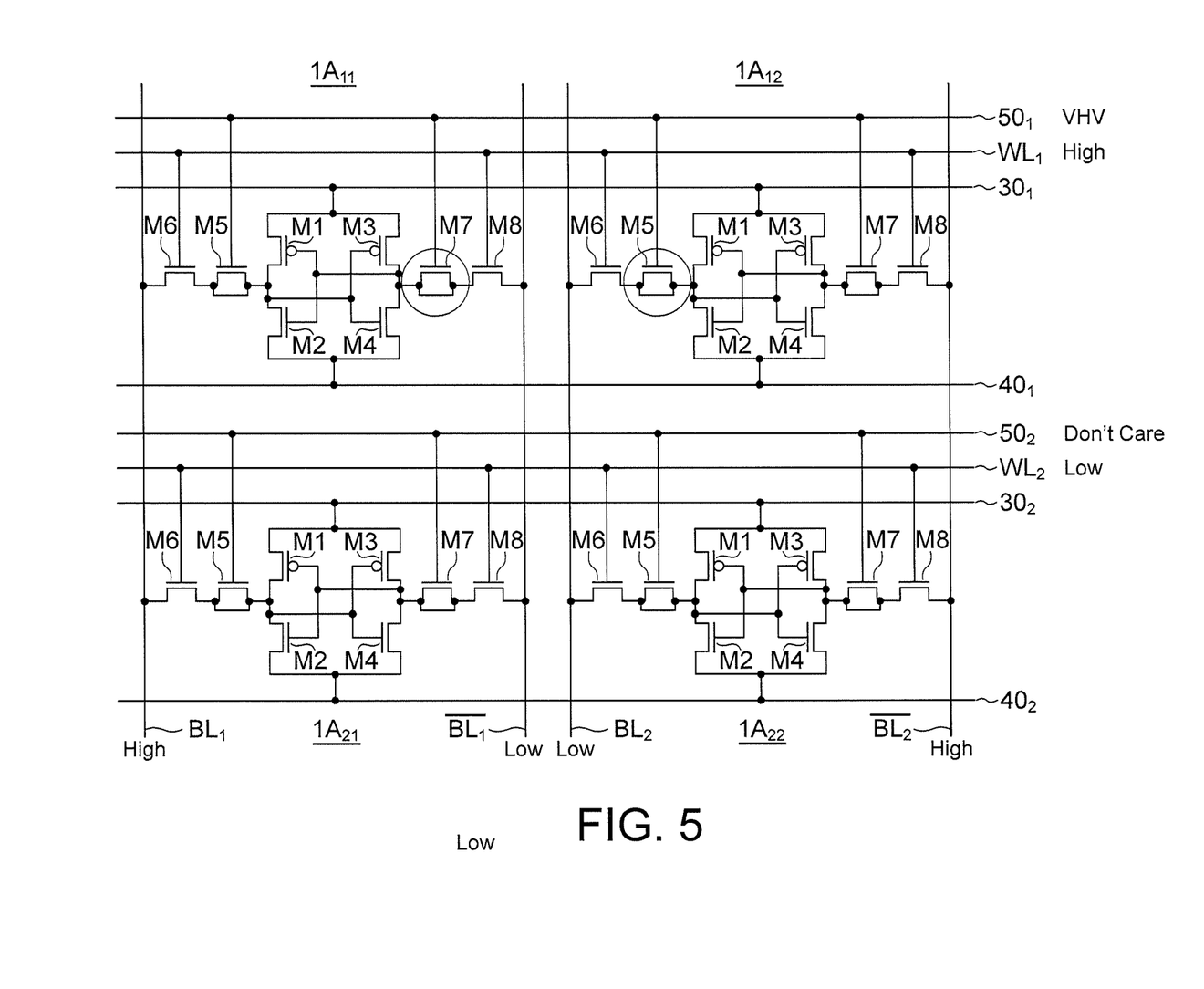
FIG. 5 is an explanatory diagram of an anti-fuse write operation of the memory circuit according to the second modification.

An anti-fuse write operation in the memory circuit having the above-described structure will be described with reference to FIGS. 5 to 7.

The write operation is performed row by row. For example, the memory cells $1A_{11}$ and $1A_{12}$ in the first row are selected, and the gate insulating film of the transistor M7 included in the memory cell $1A_{11}$ and the gate insulating film of the transistor M5 included in the memory cell $1A_{12}$, which are circled in FIG. 5, will be broken. In this case, a write voltage VHV is supplied to a write and read wiring line $50_1$, a voltage Vdd at the High level is supplied to a word line $WL_1$, a voltage Vdd is supplied to bit lines $BL_1$ and $/BL_2$, and a voltage Vss at the Low level is supplied to bit lines $/BL_1$ and $BL_2$. The voltage Vss at the Low level is also supplied to a non-selected word line $WL_2$. A voltage (<write voltage VHV) or no voltage may be supplied to a write and read wiring line $50_2$ that is connected to the non-selected row.

By supplying the voltages in this manner, the gate insulating film of the transistor M7 included in the memory cell $1A_{11}$ and the gate insulating film of the transistor M5 included in the memory cell $1A_{12}$ are broken, and the anti-fuse write operation is performed on the selected first row.

Figure 6:
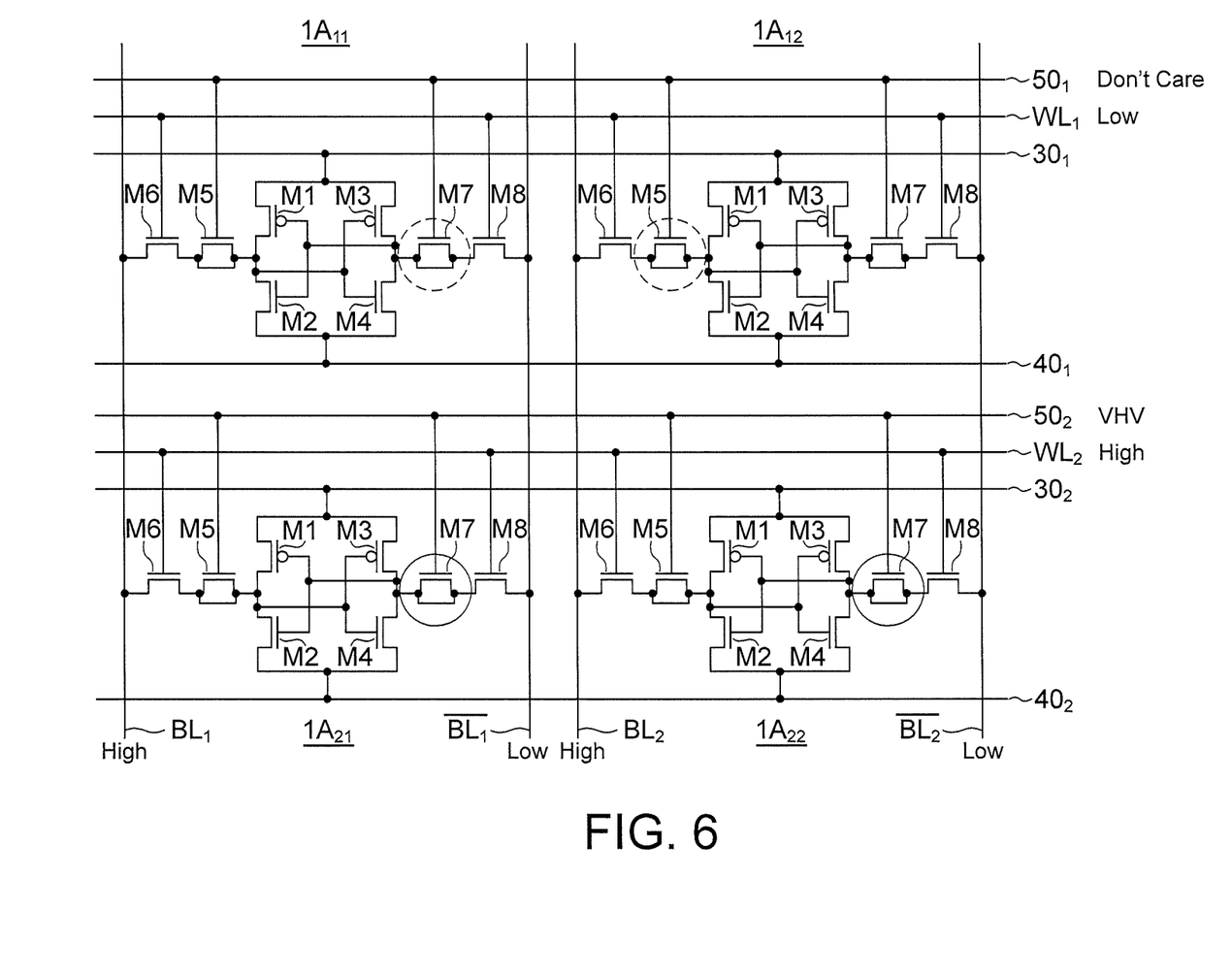
FIG. 6 is an explanatory diagram of the anti-fuse write operation of the memory circuit according to the second modification.
Figure 7:
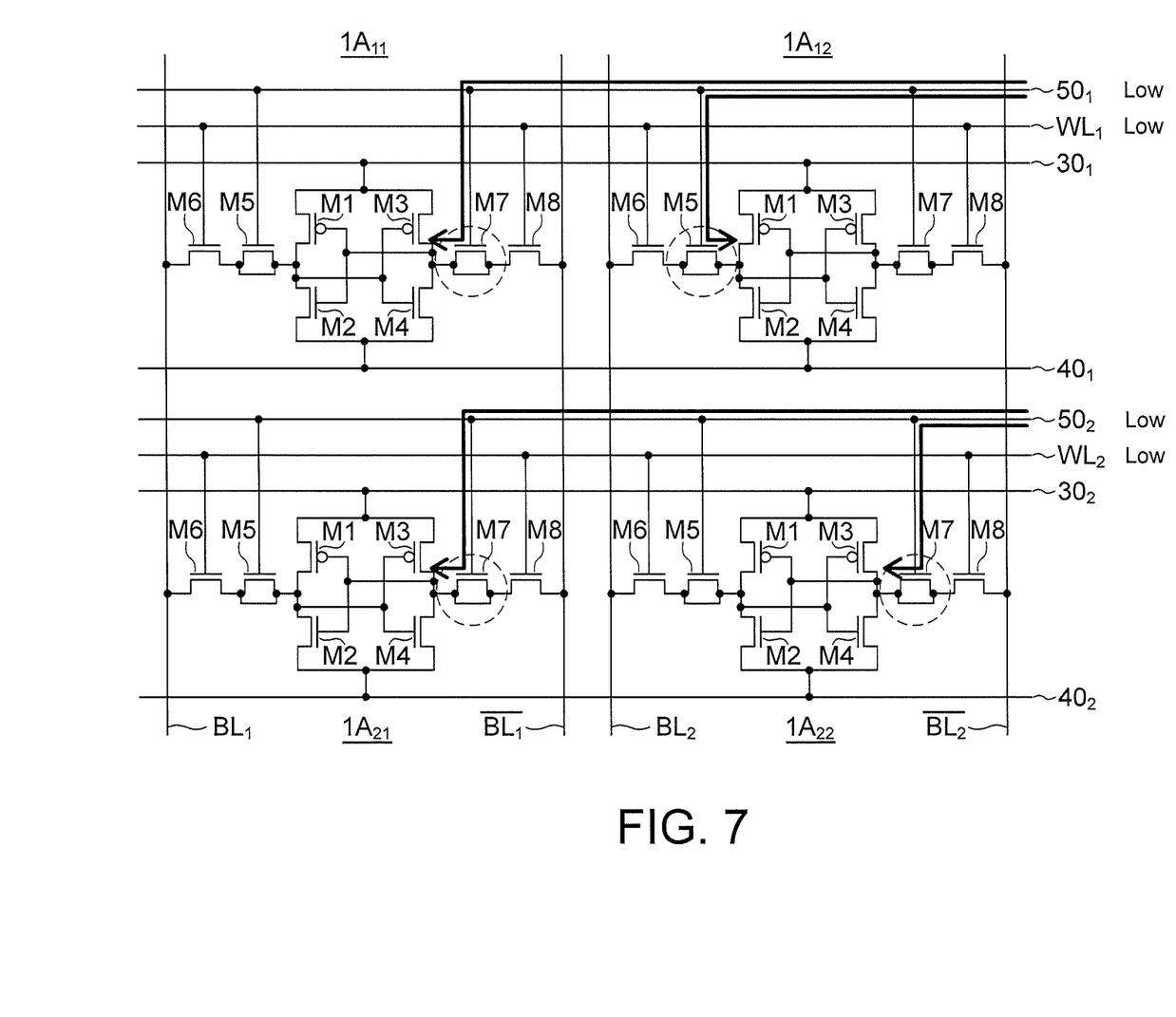
FIG. 7 is an explanatory diagram of the anti-fuse write operation of the memory circuit according to the second modification.

Next, as shown in FIG. 6, the memory cells $1A_{21}$ and $1A_{22}$ on the second row are selected, and a write operation is performed on, for example, the gate insulating film of the transistor M7 included in the memory cell $1A_{21}$ and the gate insulating film of the transistor M7 included in the memory cell $1A_{22}$. In this case, the voltage Vdd at the High level is supplied to the word line $WL_2$ connected to the selected row, the voltage Vss at the Low level is supplied to the word line $WL_1$ connected to the non-selected row, the voltage Vdd at the High level is supplied to the bit lines $BL_1$ and $BL_2$, the voltage Vss at the Low level is supplied to the bit lines $/BL_1$ and $/BL_2$, and the write voltage VHV is supplied to the write and read wiring line $50_2$. A voltage (<write voltage VHV) or no voltage may be supplied to the write and read wiring line $50_1$. As a result, the gate insulating film of the transistor M7 included in the memory cell $1A_{21}$ and the gate insulating film of the transistor M7 included in the memory cell $1A_{22}$ are broken, and the anti-fuse write operation is performed. Since the voltage Vss at the Low level is supplied to the non-selected word line $WL_1$, the memory cells $1A_{11}$ and $1A_{12}$, on which the write operation has already been performed, are not affected by the changes in voltage of the bit lines $BL_1$, $/BL_1$, $BL_2$, and $/BL_2$, and no writing is performed on these memory cells.

(Read Operation)

A read operation performed on the memory circuit according to the second modification will be described with reference to FIG. 7. In the read operation, the voltage Vss at the Low level is supplied to all of the write and read wiring lines $50_1$ and $50_2$ and word lines $WL_1$ and $WL_2$ as shown in FIG. 7. As a result, the voltage Vss at the Low level is always applied from the write and read wiring lines $50_1$ and $50_2$ to the memory cells through the transistors on which the write operation has been performed. Therefore, the values of the memory cells in the memory circuit are fixed. The value of a memory cell is read by a sense amplifier that is not shown by selecting the memory cell via the corresponding word line to cause a read current to flow from the memory cell to the corresponding bit lines BL and /BL.

The read operation may be performed in the same manner on the memory circuit according to the first embodiment shown in FIG. 1. At this time, the voltage Vss at the Low level is supplied to the write and read wiring line 50 via the transistor 24.

(Third Modification)

Figure 8:
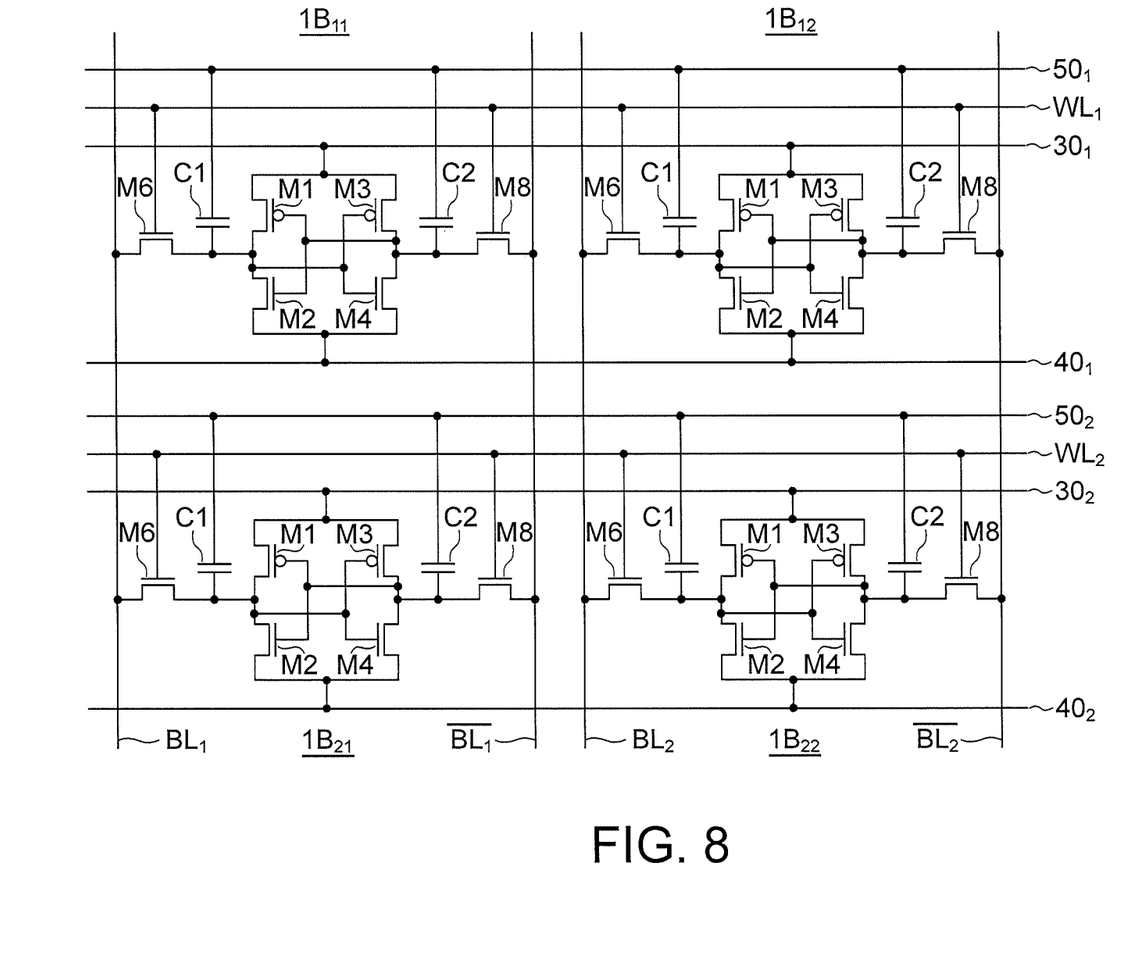
FIG. 8 is a circuit diagram of a memory circuit according to a third modification of the first embodiment.

A memory circuit according to a third modification of the first embodiment will be described with reference to FIG. 8. The memory circuit according to the third modification has a structure obtained by replacing the memory cells $1A_{11}$ to $1A_{22}$ included in the memory circuit according to the second modification shown in FIG. 4 with memory cells $1B_{11}$ to $1B_{22}$. Each memory cell $1B_{ij}$ (i, j=1, 2) has a structure obtained by replacing the anti-fuse transistors M5 and M7 of the memory cell with capacitors C1 and C2. Each of the capacitors C1 and C2 has a first terminal and a second terminal.

In each memory cell $1B_{ij}$ (i, j=1, 2), the first terminal of the capacitor C1 is connected to the output terminal of the first inverter and one of the source terminal and the drain terminal of the access transistor M6, which is opposite to the terminal connected to the bit line BL, and the second terminal is connected to the write and read wiring line $50_i$. The first terminal of the capacitor C2 is connected to the output terminal of the second inverter and one of the source terminal and the drain terminal of the access transistor M8, which is opposite to the terminal connected to the bit line /BL, and the second terminal is connected to the write and read wiring line $50_i$.

A write operation and a read operation may be performed on the memory circuit according to the third modification having the above-described structure in the same manner as those performed on the memory circuit according to the second modification shown in FIG. 4. Thus, the capacitors C1 and C2 serve as anti-fuses. The capacitors may be formed on wiring layers, for example the write and read wiring lines $50_1$ and $50_2$, by a standard CMOS process. The footprint of Si may be reduced in this way.

(Fourth Modification)

In the first embodiment and its first to third modifications, a write operation is simultaneously performed on anti-fuses connected to a write and read wiring line. After the write operation, the anti-fuses are in the low-resistance state. Therefore, a current corresponding to their resistance value flows through them. If data is written to a plurality of cells, an IR drop may be caused by the current flowing in the write operation, which may reduce the voltage applied to the memory cells on which no data is intended to be written. A large-scale FPGA includes a great number of configuration memories. Therefore, a large number of memory elements are connected to a single word line $WL_n$. Depending on the number of memory elements, the number of the p-channel MOS transistors for write operation, for allowing data to be written to the memory elements at the same time may be insufficient. In short, the number of cells on which a write operation may be performed at a time has a limit. A configuration memory circuit that may solve this problem will be described as a fourth modification below.

Figure 9:
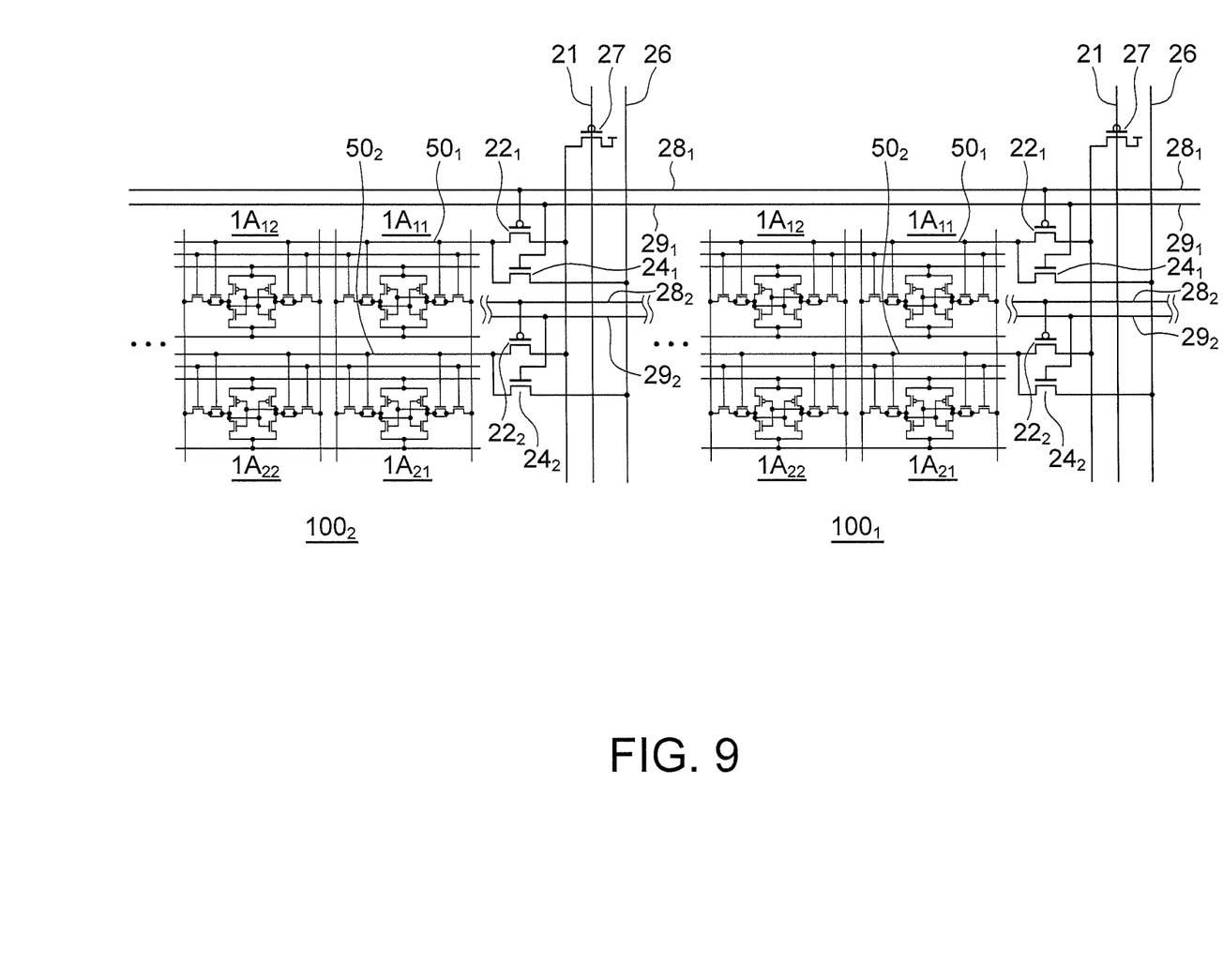
FIG. 9 is a circuit diagram of a memory circuit according to a fourth modification of the first embodiment.

FIG. 9 shows the memory circuit according to the fourth modification of the first embodiment. The memory circuit according to the fourth modification includes two or more memory cell arrays $100_1$ and $100_2$. Each memory cell array $100_i$ (i=1, 2) includes memory cells $1A_{kl}$ (k=1, ..., m, l=1, ..., n) arranged in m (m≥2) rows and n (n≥2) columns. Each memory cell $1A_{kl}$ (k=1, ..., m, l=1, ..., n) has the same structure as the memory cell 1A shown in FIG. 2. In each memory cell array $100_i$ (i=1, 2), the column number increases from right to left, unlike the memory circuit shown in FIG. 4.

In each memory cell array $100_i$ (i=1, 2), a p-channel MOS transistor $22_1$, which is a high-breakdown-voltage transistor, for supplying a write voltage VHV and an n-channel MOS transistor $24_1$ for supplying a Low level voltage, for example a voltage Vss, are provided to the write and read wiring line $50_i$ connected to the memory cells $1A_{1l}$ (l=1, ..., n) of the first row, and a p-channel MOS transistor $22_2$, which is a high-breakdown-voltage transistor, for supplying the write voltage VHV and an n-channel MOS transistor $24_2$ for supplying a voltage at the Low level, for example the voltage Vss, are provided to the write and read wiring line $50_2$ connected to the memory cells $1A_{2l}$ (l=1, ..., n) of the second row. Each memory cell array $100_1$ (i=1, 2) also includes a p-channel MOS transistor 27, which is a high-breakdown-voltage transistor, for supplying the write voltage VHV to the p-channel MOS transistor $22_1$ and the p-channel MOS transistor $22_2$, write wiring lines $28_1$ and $28_2$ for turning on the p-channel MOS transistor $22_1$ and the p-channel MOS transistor $22_2$, and read wiring lines $29_1$ and $29_2$ for turning on the n-channel MOS transistor $24_1$ and the n-channel MOS transistor $24_2$. Each memory cell array $100_i$ (i=1, 2) further includes a wiring line 26 for supplying a Low-level voltage, for example the voltage Vss, to the n-channel MOS transistors $24_1$ and $24_2$, and a wiring line 21 for supplying a voltage to the p-channel MOS transistor 27, which is a high-breakdown-voltage transistor.

The number of memory cells arranged in each row of each memory cell array $100_1$ (i=1, 2) is limited to the number that allows a normal write operation to be performed. A write operation and a read operation may be performed on each memory cell array $100_1$ (l=1, 2) in the same manner as those performed on the memory circuit according to the second modification.

(Fifth Modification)

Figure 10:
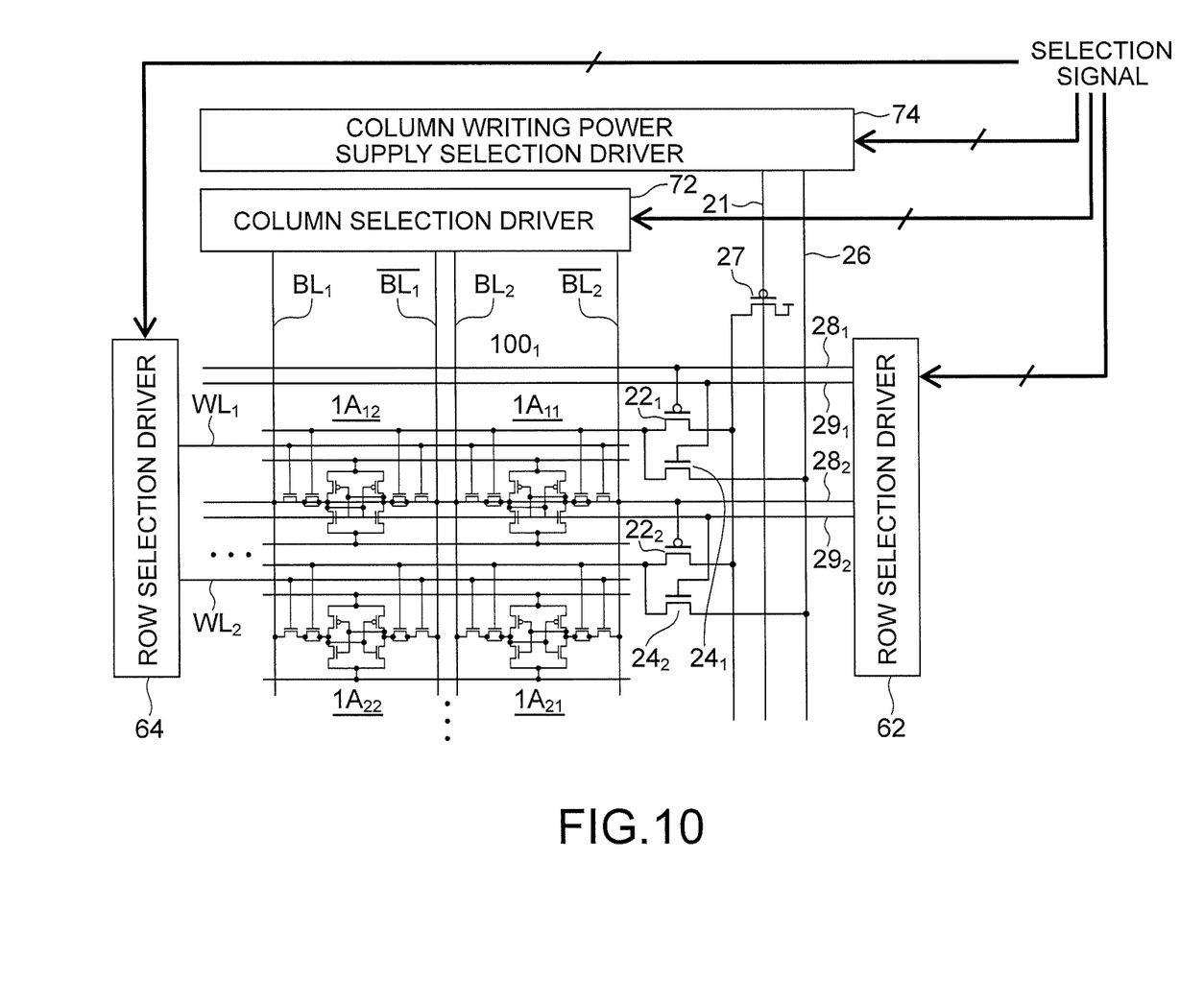
FIG. 10 is a circuit diagram of a memory circuit according to a fifth modification of the first embodiment.

FIG. 10 shows a memory circuit according to a fifth modification of the first embodiment. The memory circuit according to the fifth modification has a structure obtained by adding a row selection driver 62, a row selection driver 64, a column selection driver 72, and a column writing power supply selection driver 74 to the memory circuit according to the fourth modification shown in FIG. 9. The memory cell array $100_1$ is only shown in FIG. 10, and the memory cell array $100_2$ is omitted.

The row selection driver 62 is connected to the write wiring lines $28_1$ and $28_2$ to select one of the write wiring lines $28_1$ and $28_2$ in accordance with a selection signal, and apply a voltage to the selected write wiring line, for example the write wiring line $28_1$, to turn on the p-channel MOS transistor $22_1$, which is a high-breakdown-voltage transistor, connected to the write wiring line $28_1$. The row selection driver 62 is also connected to the read wiring lines $29_1$ and $29_2$ to select one of the read wiring lines $29_1$ and $29_2$ in accordance with a selection signal, and apply a voltage to the selected read wiring line, for example the read wiring line $29_1$, to turn on the n-channel MOS transistor $24_1$, which is a high-breakdown-voltage transistor, connected to the read wiring line $29_1$.

The row selection driver 64 is connected to the word lines $WL_1$ and $WL_2$ to select one of the word lines $WL_1$ and $WL_2$ in accordance with a selection signal, and apply a High level voltage, for example the voltage Vdd, to the selected word line, for example the word line $WL_1$.

The column selection driver 72 applies a High level voltage or a Low level voltage to the bit lines $BL_1$, $/BL_1$, $BL_2$, and $/BL_2$ in accordance with a selection signal.

The column writing power supply selection driver 74 is connected to the wiring lines 21 and 26, and applies a voltage to the wiring line 21 or the wiring line 26 in accordance with a selection signal.

As described above, in the memory circuit according to any of the first embodiment and its modifications, each memory cell includes a transistor or a capacitor serving as an anti-fuse element, which may be made by a standard CMOS process. Therefore, an increase in manufacturing costs may be curbed, and the possibility of the occurrence of soft error may be reduced.

Second Embodiment

Figure 11:
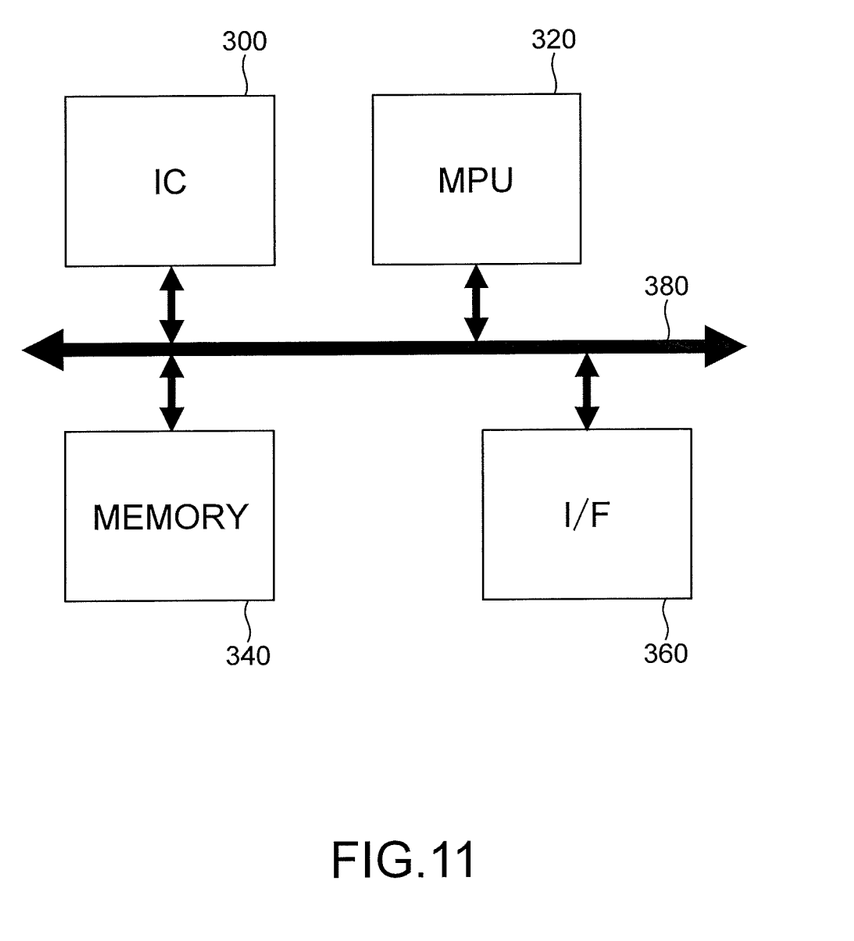
FIG. 11 is a block diagram of an electronic device according to a second embodiment.

FIG. 11 shows an electronic device according to a second embodiment. The electronic device according to the second embodiment includes a circuit 300 including a memory circuit according to any of the first embodiment and its modifications, a microprocessor (MPU) 320, a memory 340, and an interface (I/F) 360. These elements are connected via a bus line 380.

The MPU 320 operates in accordance with a program. The memory 340 stores the program for operating the MPU 320. The memory 340 also serves as a work memory when the MPU 320 operates. The I/F 360 is controlled by the MPU 320 to communicate with an external device.

The second embodiment has the same effects as the first embodiment and its modifications.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. A memory circuit comprising:
a first inverter circuit including a first input terminal, a first output terminal, a first p-channel MOS transistor in which a source terminal is connected to a first power supply line and a gate terminal is connected to the first input terminal, and a first n-channel MOS transistor in which a source terminal is connected to a second power supply line, a drain terminal is connected to a drain terminal of the first p-channel MOS transistor, and a gate terminal is connected to the first input terminal;
a second inverter circuit including a second input terminal connected to the first output terminal, a second output terminal connected to the first input terminal, a second p-channel MOS transistor in which a source terminal is connected to the first power supply line and a gate terminal is connected to the second input terminal, and a second n-channel MOS transistor in which a source terminal is connected to the second power supply line, a drain terminal is connected to a drain terminal of the second p-channel MOS transistor, and a gate terminal is connected to the second input terminal;
a third n-channel MOS transistor in which one of a source terminal and a drain terminal is connected to the first output terminal and the second input terminal, the source terminal is connected to the drain terminal, and a gate terminal is connected to a first wiring line;
a fourth n-channel MOS transistor in which one of a source terminal and a drain terminal is connected to the other of the source terminal and the drain terminal of the third re-channel MOS transistor, and the other of the source terminal and the drain terminal is connected to a second wiring line, and a gate terminal is connected to a third wiring line;
a fifth n-channel MOS transistor in which one of a source terminal and a drain terminal is connected to the second output terminal and the first input terminal, the source terminal is connected to the drain terminal, and a gate terminal is connected to the first wiring line; and
a sixth n-channel MOS transistor in which one of a source terminal and a drain terminal is connected to the other of the source terminal and the drain terminal of the fifth n-channel MOS transistor, the other of the source terminal and the drain terminal is connected to a fourth wiring line, and a gate terminal is connected to the third wiring line.

2. The memory circuit according to claim 1, further comprising:
a third p-channel MOS transistor, in which a source terminal is connected to a first power supply and a drain terminal is connected to the first wiring line, the third p-channel MOS transistor including a gate insulating film that is thicker than gate insulating films of the first p-channel MOS transistor and the second p-channel MOS transistor; and
a seventh n-channel MOS transistor, in which a source terminal is connected to a second power supply and a drain terminal is connected to the first wiring line, the seventh re-channel MOS transistor including a gate insulating film that is thicker than gate insulating films of the first to fourth n-channel MOS transistors.

3. The memory circuit according to claim 2, further comprising a fourth p-channel MOS transistor in which a gate insulating film is thicker than the gate insulating films of the first p-channel MOS transistor and the second p-channel MOS transistor, the fourth p-channel MOS transistor being disposed between the drain terminal of the third p-channel MOS transistor and the first power supply.

4. The memory circuit according to claim 1, further comprising a control circuit configured to supply a voltage to the third wiring line for turning on the fourth n-channel MOS transistor and the sixth n-channel MOS transistor, supply a first voltage to one of the second wiring line and the fourth wiring line and a second voltage that is lower than the first voltage to the other of the second wiring line and the fourth wiring line, and supply a write voltage to the first wiring line.

5. An electronic device comprising:
   the memory circuit according to claim 1;
   a memory that stores a program; and
   a processor that executes processing on the memory circuit in accordance with the program stored in the memory.

* * * * *